(12) United States Patent
Gelorme et al.

(10) Patent No.: US 7,063,127 B2
(45) Date of Patent: Jun. 20, 2006

(54) METHOD AND APPARATUS FOR CHIP-COOLING

(75) Inventors: Jeffrey D. Gelorme, Burlington, CT (US); Hendrik F. Hamann, Yorktown Heights, NY (US); Nancy C. LaBianca, Yalesville, CT (US); Yves C. Martin, Ossining, NY (US); Theodore G. Van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 10/665,798

(22) Filed: Sep. 18, 2003

(65) Prior Publication Data

US 2005/0061474 A1 Mar. 24, 2005

(51) Int. Cl.
*F28F 7/00* (2006.01)

(52) U.S. Cl. ............ 165/80.2; 165/80.4; 165/185

(58) Field of Classification Search ...... 165/80.2–80.5, 165/185, 104.19, 104.33
See application file for complete search history.

(56) References Cited

U.S. PATENT DOCUMENTS

| | | | | |
|---|---|---|---|---|
| 3,586,102 A | * | 6/1971 | Gilles ..................... | 165/185 |
| 4,034,468 A | | 7/1977 | Koopman | |
| 4,323,914 A | * | 4/1982 | Berndlmaier et al. ....... | 257/713 |
| 4,563,375 A | * | 1/1986 | Ulrich ..................... | 165/46 |
| 4,686,606 A | | 8/1987 | Yamada et al. ............. | 361/385 |
| 4,997,032 A | * | 3/1991 | Danielson et al. ..... | 165/104.19 |
| 5,000,256 A | * | 3/1991 | Tousignant ............ | 165/104.19 |
| 5,365,402 A | * | 11/1994 | Hatada et al. ............. | 165/80.4 |
| 5,561,590 A | * | 10/1996 | Norell et al. ............... | 165/185 |
| 6,665,186 B1 | * | 12/2003 | Calmidi et al. ............ | 165/80.4 |
| 2002/0088605 A1 | * | 7/2002 | Malhammar ................ | 165/46 |
| 2004/0074630 A1 | * | 4/2004 | Sen et al. ............. | 165/104.33 |
| 2004/0188829 A1 | * | 9/2004 | Hu et al. .................... | 257/712 |

OTHER PUBLICATIONS

Hultmark, et al., "Thermal Enhancement of Modules", IBM Technical Disclosure Bulletin, Jan. 1977, pp. 3127-3128.
"Liquid Metal Cooled Integrated Circuit Module Structures", IBM Technical Disclosure Bulletin, Apr. 1978, pp. 4817-4818.

* cited by examiner

*Primary Examiner*—Teresa J. Walberg
(74) *Attorney, Agent, or Firm*—Wan Yee Cheung, Esq.

(57) ABSTRACT

A thermal interface for IC chip cooling is provided. One embodiment of the thermal interface includes a thermally conductive liquid or paste-like metal(s) disposed within a flexible, thermally conductive enclosure. The enclosure is adapted to be placed between an IC chip and a heat sink to enhance heat transfer from the chip to the heat sink, thereby enabling quicker and more efficient cooling of the chip than can be achieved by conventional techniques. In several embodiments, the thermal interface is held in place by mechanical pressure rather than by bonding, which further facilitates inspection and repair of the IC device.

27 Claims, 9 Drawing Sheets

METHOD AND APPARATUS FOR CHIP-COOLING

BACKGROUND

The invention relates generally to integrated circuits, and relates more particularly to the cooling of integrated circuit chips. Specifically, the present invention relates to a heat conducting pad for chip cooling.

Efficient cooling of integrated circuit (IC) devices is essential to prevent failure due to excessive heating. Efficient cooling of the IC chips depends in large part on good contact between the chips and cooling blocks, because a major part of the heat resistance budget is expended between the chip and the heat sink block.

Conventionally, heat transfer between a chip and a heat sink is facilitated by providing a thin layer of thermally conductive paste disposed between opposing surfaces of the chip and the heat sink unit. Typically, the layer of paste is approximately 100 microns thick and is mechanically compliant to conform to the sometimes irregular surfaces of the chip and heat sink.

Such conductive pastes have generally proven to be reliable in facilitating heat transfer; however, the thermal conductivity of conventional pastes is generally limited (e.g., typical pastes have a thermal conductivity of approximately 5 W/mK). Thus, limited chip cooling is achieved. Furthermore, heavy cycling may cause non-uniform behavior in a paste, or may cause a paste to fail to thermally bond the chip to the heat sink, resulting in thermal run-away and also limiting chip cooling. Because a paste cannot be inspected during deployment or while in service, it is difficult to determine whether insufficient chip cooling can be attributed to failure of the paste. The use of a thermally conductive paste also complicates the repair of an IC device because it bonds directly to the device components, making removal of components difficult and time-consuming.

Thus, there is a need for a heat transfer apparatus that is capable of establishing reliable thermal contact, and of providing sufficient thermal conductivity and mechanical compliance between a chip and a heat sink.

SUMMARY OF THE INVENTION

The present invention is a thermal interface for IC chip cooling. One embodiment of the invention comprises thermally conductive liquid or paste-like metal(s) disposed within a flexible, thermally conductive enclosure. For example, the conductive liquid metal is confined between one or more metal foils, in one or more dimensions thereby forming a flexible heat-conductive pad. The enclosure is adapted to be placed between a heat source, e.g., an IC chip, and a heat sink to enhance heat transfer from the source to the sink, thereby enabling quicker and more efficient cooling of the IC chip than can be achieved by conventional techniques. In several embodiments, the thermal interface is held in place by mechanical pressure rather than by bonding. This facilitates ease of inspection and repair of the IC device.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Figure 1:
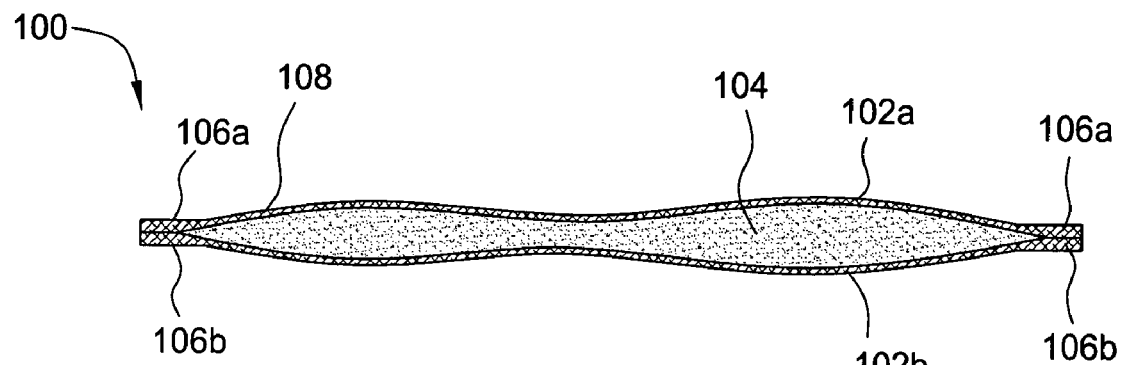
FIG. 1 illustrates a cross sectional view of one embodiment of a thermal interface apparatus according to the present invention.

FIG. 1 is a cross sectional view of one embodiment of a thermal interface 100 according to the present invention. In one embodiment, the thermal interface 100 comprises two thin sheets 102a, 102b formed of a flexible, thermally conductive material and a thin layer 104 of a thermally conductive liquid, e.g., liquid metal. The sheets 102a and 102b are sealed together around their perimeter edges 106a and 106b to form a flexible enclosure 108 within which the liquid metal layer 104 is contained. In another embodiment, the enclosure 108 may be a unitary piece formed from a single sheet and sealed at one or more edges (e.g., a single sheet may be folded over and sealed around three edges). Thus, the thermal interface 100 can be a heat conducting pad. In a further embodiment, channels may be formed in at least one sheet 102a or 102b to allow the liquid metal 104 to circulate in and out of the enclosure 108.

In one embodiment, the sheets 102a and 102b are formed of a thermally conductive metal foil. Suitable materials for forming the sheets 102a and 102b include, but are not limited to, copper, aluminum, stainless steel, silicon, nickel and the like. In one embodiment, the sheets 102a and 102b have a thickness of approximately 10 micron. In another embodiment, the sheets 102a and 102b are made of silicon and have a thickness of approximately 100 micron. The liquid metal layer 104 comprises a metal that is in a liquid or fluid state (e.g., not substantially more viscous than conventional polymer paste materials) near ambient temperature. Suitable liquid metals include, but are not limited to, gallium, mercury and combinations, mixtures, alloys or amalgams including gallium-indium, mercury-gold and the like. In one embodiment, the liquid metal layer 104 comprises approximately forty micro liters of liquid.

Figure 2:
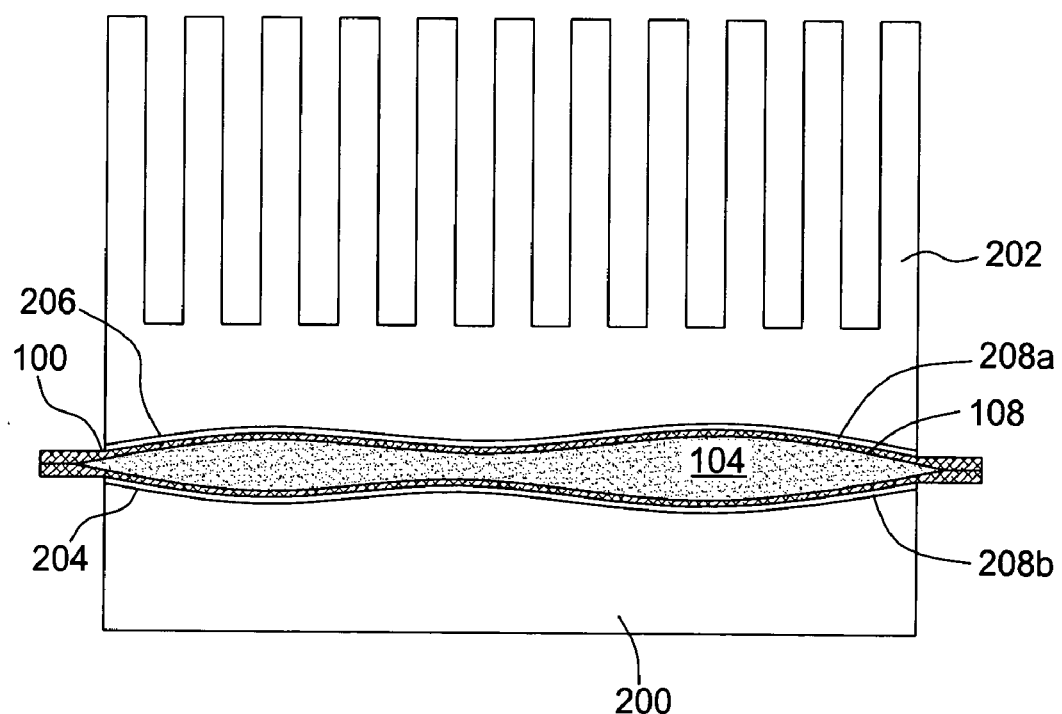
FIG. 2 illustrates a cross sectional view of the thermal interface of FIG. 1 in use with an IC chip and a heat sink.

FIG. 2 is a cross sectional view of the thermal interface 100 of FIG. 1 in use with a heat source, e.g., IC chip 200, and a heat sink 202. The thermal interface 100 is positioned between the facing surfaces of a first surface 204 of the chip 200 and a first surface 206 of the heat sink 202. Methods for maintaining the thermal interface 100 between the chip 200 and the heat sink 202 include conventional spring-screw systems (not shown), among others. Because the enclosure 108 confines the liquid metal 104, clamping pressure is transmitted uniformly throughout the liquid metal 104, and the pressure forces the sheets 102a and 102b into intimate mechanical contact with the first surface 204 of the chip 200 and the first surface 206 of the heat sink 202, so that the flexible sheets 102a and 102b conform closely to the surfaces 204, 206 of the chip 200 and the heat sink 202. The sheets 102a and 102b both maintain the liquid pressure within the enclosure 108, and prevent outside air from forming voids within the liquid metal layer 104.

Good thermal contact between the sheets 102a and 102b and the chip 200 and heat sink 202 is important in order to maintain effective heat transfer between the chip 200 and the heat sink 202. One intention of the thermal interface design is therefore to force the sheets 102a and 102b into intimate contact with the chip 200 and the heat sink 202. In one embodiment, at least one optional optimization layer 208a or 208b (hereinafter collectively referred to as "optimization layer(s) 208") is disposed between the thermal interface 100 and the chip 200 (e.g., layer 208b) and/or between the thermal interface 100 and the heat sink 202 (e.g., layer 208a). The optimization layer 208 ensures that thermal contact between the thermal interface 100 and the chip 200 and/or the heat sink 202 remains constant over time. The optimization layer 208 is very thin, and in one embodiment comprises water, epoxy, oil, paste, solder, organic fluid (e.g., hexane) or a liquid metal. In the event that the optimization layer 208 comprises a fluid having a low conductivity (such as oil, water, etc.), the pressure exerted on the sheets 102a and 102b through the intimate contact with the chip 200 and heat sink 202 will squeeze the liquid into a very thin layer with a low thermal resistance. If rework is not an issue, the optimization layer 208 can be made of a more permanent bonding agent such as solder or epoxy. Because the edges 106a and 106b of the sheets 102a and 102b are still free to move, a small and sufficient amount of mechanical motion is still allowed between the chip 200 and the heat sink 202.

The thermal interface 100 enables significantly improved chip cooling over conventional conductive pastes, due in part to the higher thermal conductivity of the apparatus 100 (for example, the thermal conductivity of liquid gallium is 28 W/mK). In one embodiment, heat transfer between the chip 200 and the heat sink 202 is improved by a factor of at least approximately five by incorporating the thermal interface 100 into the IC device. Furthermore, because each thermal interface 100 can be produced with substantially similar dimensions and properties, thermal cycling is not likely to change the dimensions or properties in an irreversible manner, making the thermal interface 100 more reliable than conventional pastes.

In addition, incorporation of the thermal interface 100 into an IC device significantly increases the ease of making repairs and inspections of the IC device and its components. For example, because the thermal interface 100 is not bonded to the chip 200 or to the heat sink 202 (the thermal interface 100 is held in place by mechanical pressure), the thermal interface 100 may be easily removed from the IC device. This is especially useful in the repair of multi-chip devices. In addition, in one embodiment, an array of thin film thermocouples may be lithographically placed onto at least one of the sheets of the thermal interface 100 to monitor the temperature difference between the IC chip 200 and the heat sink 202 when the IC device is assembled or in operation. This allows the efficiency of the thermal interface 100 to be monitored at any time.

Figure 3:
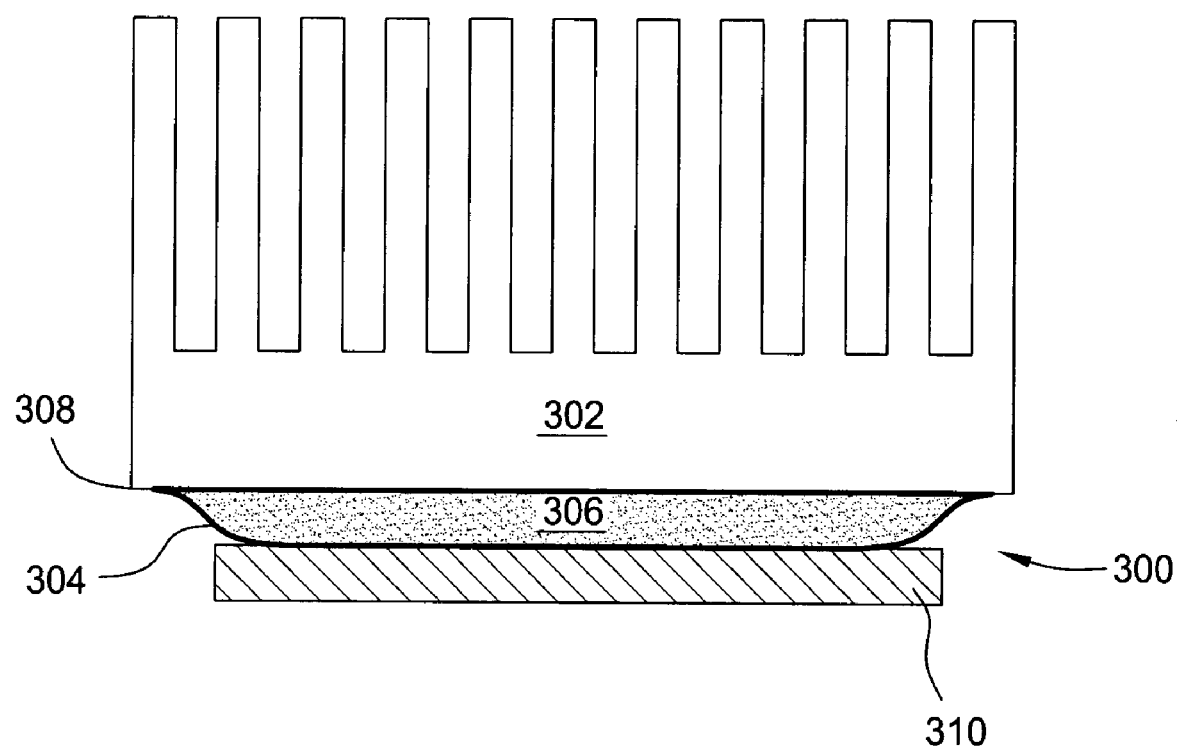
FIG. 3 illustrates a cross sectional view of a second embodiment of a thermal interface according to the present invention, wherein said thermal interface is integral with a heat sink block.

FIG. 3 is a cross sectional view of a second embodiment of a thermal interface 300 according to the present invention. The thermal interface 300 is substantially similar to the thermal interface 100 discussed with respect to FIGS. 1 and 2; however, the thermal interface 300 is integrated directly into the heat sink 302. The thermal interface 300 therefore comprises only one flexible sheet 304, and the liquid metal 306 is retained between the sheet 304 and the first surface 308 of the heat sink 302. Integration of the thermal interface 300 with the heat sink 302 simplifies the design mechanically, and also significantly improves thermal conductivity by eliminating a layer of sheet material from the thermal interface 300 (i.e., the sheet of the enclosure 108 that is adjacent to the heat sink 202 in FIG. 2) between the chip 310 and the heat sink 302. Thus a semi-flexible enclosure is defined between the sheet 304 and the first surface 308 of the heat sink 302.

Figure 4:
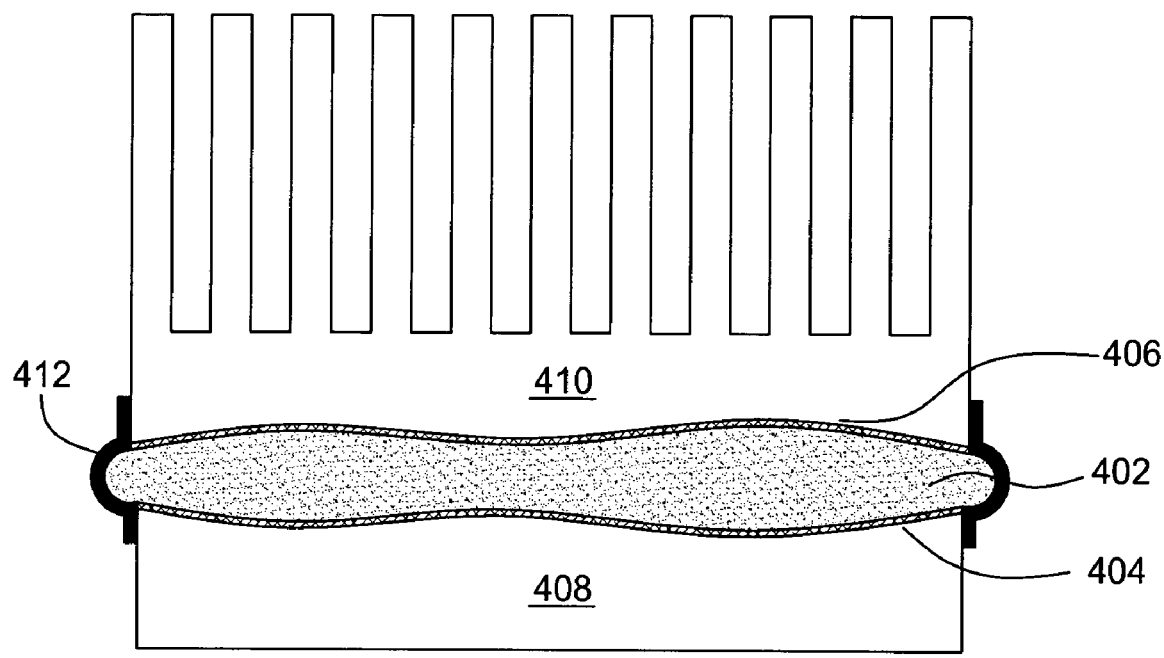
FIG. 4 illustrates a cross sectional view of a third embodiment of a thermal interface according to the present invention, wherein said thermal interface is retained between a chip and a heat sink by at least one flexible gasket.

FIG. 4 is a cross sectional view of a third embodiment of a thermal interface 400 according to the present invention. In the embodiment illustrated, the liquid metal 402 is retained by the first surfaces 404, 406 of the chip 408 and the heat sink 410, and by a resilient gasket 412 that seals the perimeter of the chip/heat sink interface. The elimination of sheets such as those described with reference to FIGS. 2 and 3 to retain the liquid metal 402 allows the liquid metal 402 to directly contact both the chip 408 and the heat sink 410, providing enhanced thermal contact between the two. Those skilled in the art will appreciate the gasket 412 may take any form that allows the gasket 412 to trap the liquid metal 402 between the chip 408 and the heat sink 410, including, but not limited to, an "O" ring seal positioned between the chip 408 and the heat sink 410.

Figure 5:
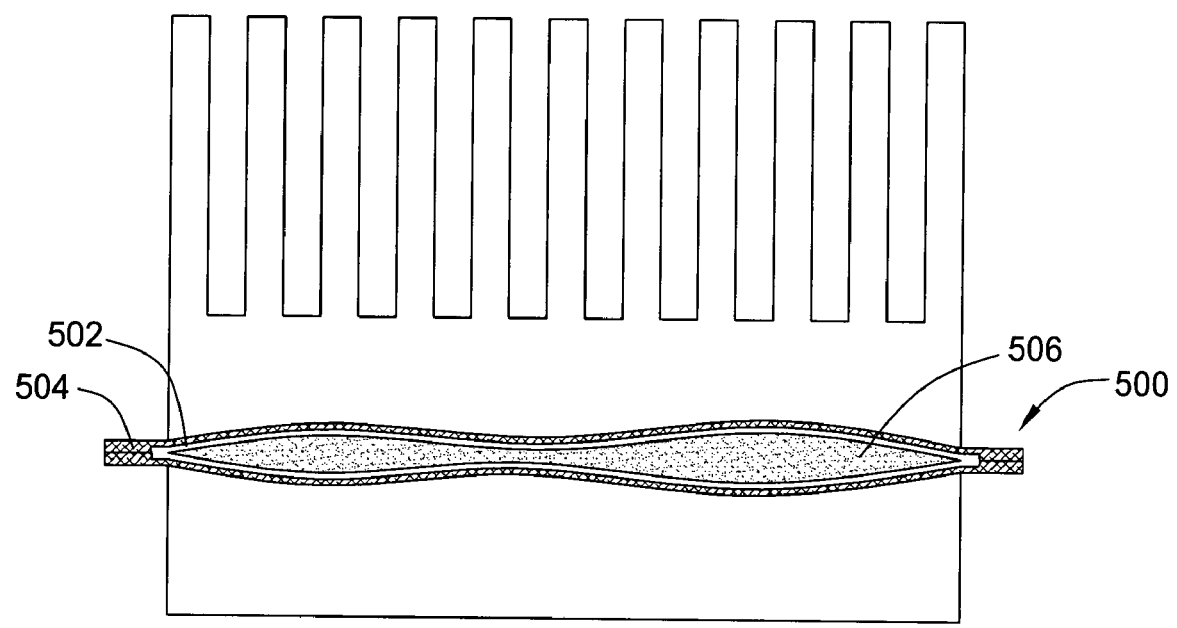
FIG. 5 illustrates a cross sectional view of a fourth embodiment of a thermal interface according to the present invention, wherein said thermal interface includes a liner.

FIG. 5 is a cross sectional view of a fourth embodiment of a thermal interface 500 according to the present invention. The thermal interface 500 is substantially similar to the thermal interface 100 described with respect to FIGS. 1 and 2; however, a liner 502 lines the interior surface of the enclosure 504. The liner 502 comprises a thin layer of a flexible, thermally conductive material. The liner substantially prevents chemical reactions between the liquid metal 506 and the sheets of the enclosure 504, and also improves wetting of the liquid metal 506 to the sheets of the enclosure 504 (which increases thermal conductivity). In one embodiment, the liner 502 is formed from a chemically inert material. Suitable chemically inert materials include, but are not limited to, noble metals (e.g., platinum, tantalum and gold, among others). In further embodiments, the liner 502 is formed from a material that adheres well to the interior surface of the enclosure 504 and remains stable when subjected to variations in temperature (e.g, substantial variations in heat or cold).

Figure 6:
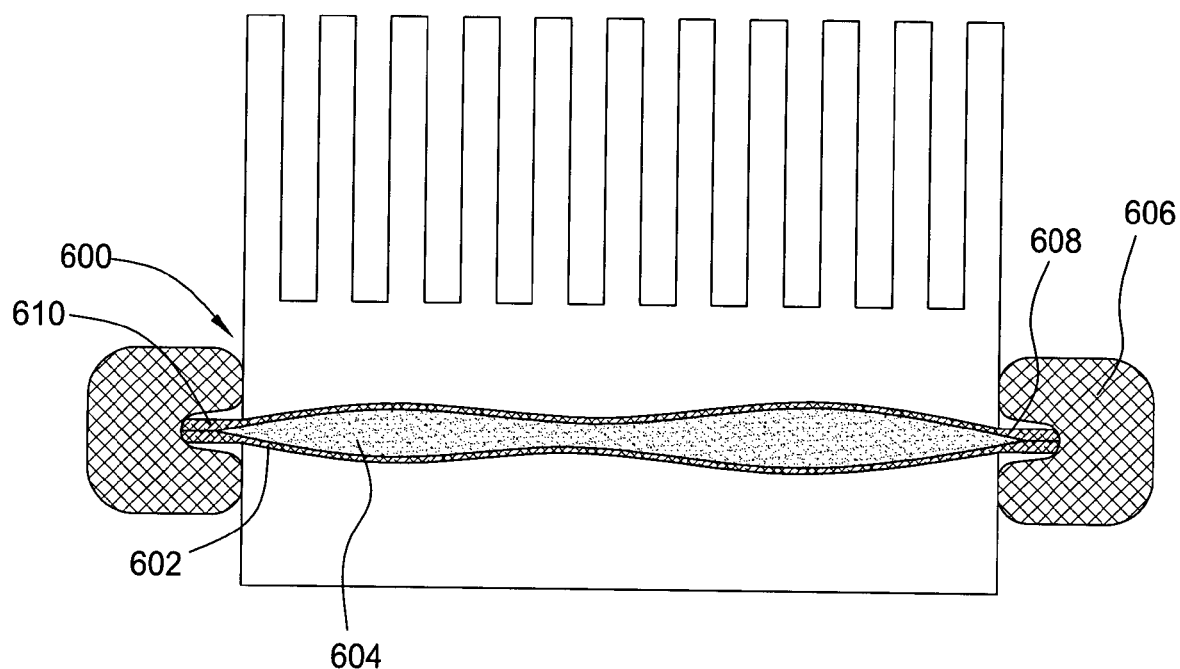
FIG. 6 illustrates a cross sectional view of a fifth embodiment of a thermal interface according to the present invention, wherein said thermal interface includes at least one containment pad for preventing leakage.

FIG. 6 is a cross sectional view of a fifth embodiment of a thermal interface 600 according to the present invention. In the illustrated embodiment, the thermal interface 600 comprises a flexible enclosure 602 containing a liquid metal 604 (similar to the apparatus 100 illustrated in FIG. 1), and one or more containment pads 606. The containment pads 606 are positioned around the perimeter of the chip/heat sink interface to curtail contamination of the IC device due to accidental spill of the liquid metal 604. In one embodiment, the containment pads 606 include an indentation 608 that is positioned to receive a perimeter edge 610 of the thermal interface 600. The indentation 608 isolates the edge 610 of the thermal interface 600 from the outside environment, so that if the thermal interface 600 should leak, liquid metal 604 will be captured within the indentation 608 and will not contaminate or interfere with the components of the IC device. The containment pad 606 may comprise a single pad 606 that extends all the way around the perimeter edge 610 (i.e., a ring), or several individual containment pads 606 may be deployed. In one embodiment, the pads are formed from a resilient, substantially non-porous material such as a silicone polymer. In another embodiment, the pads are formed from an absorbent material, possibly a metallic getter material in a sponge-like polymer such as powdered aluminum in a sponge-like polystyrene to prevent runaway of the liquid metal 604.

Figure 7:
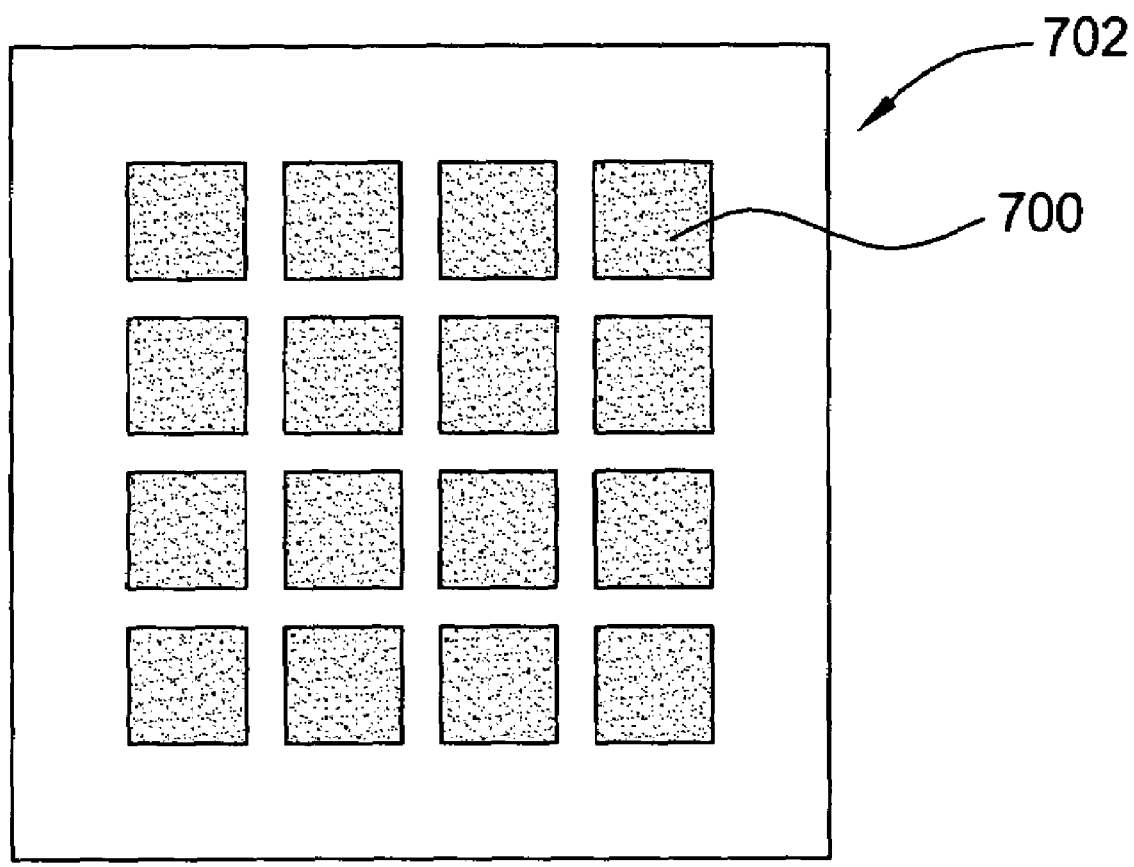
FIG. 7 illustrates a plan view of one embodiment an interposer using a plurality of thermal interfaces according to the present invention.

FIG. 7 is a top plan view of one embodiment of an interposer 702 using a plurality of thermal interfaces 700 according to the present invention. The interposer 702 may be advantageously incorporated into an IC device in which a single heat sink is used to cool two or more IC chips simultaneously. For example, in the embodiment illustrated in FIG. 7, each thermal interface 700 is in thermal contact with an IC chip (not shown, e.g., the chips are underneath the thermal interfaces 700), and a single heat sink sized to maintain thermal contact with each chip/thermal interface 700 simultaneously may be placed upon the interposer 702. The thermal interfaces 700 may be assembled in accordance with any of the embodiments described herein, and two or more different embodiments may be incorporated simultaneously into a single interposer 702. In one embodiment, an interposer 702 comprises a first large, thermally conductive sheet having several regions of liquid metal formed thereon. The liquid metal regions are each retained by smaller, individual second pads. An interposer 702 assembled as described herein may be inspected, for example by X-ray or ultrasound, to insure the absence of voids (i.e., pockets of air) in the thermal interfaces 700.

Figure 8:
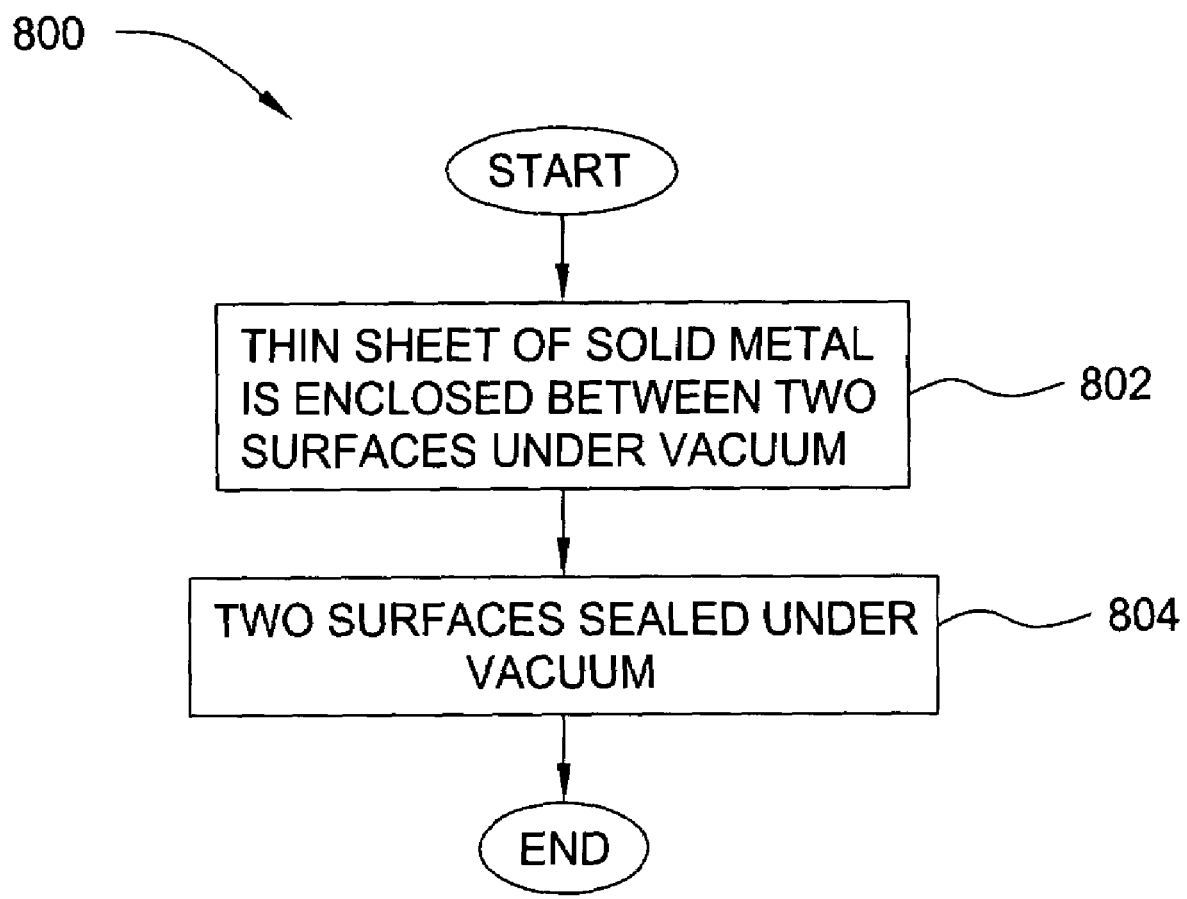
FIG. 8 illustrates a flow diagram illustrating one method of fabricating a thermal interface according to the present invention, wherein said thermal interface is vacuum sealed.

FIG. 8 is a flow diagram illustrating a method 800 of fabricating a thermal interface according to the present invention. At step 802, a thin sheet of thermally conductive metal (e.g., gallium), held at a temperature below its melting point (e.g., so that the metal is presently in its solid phase), is enclosed between two surfaces under vacuum. At least one of the two surfaces is flexible (e.g., the sheet of metal is enclosed between two sheets, between two sides of a unitary enclosure, or between a sheet and a heat sink). At step 804, the two surfaces are sealed in the vacuum to prevent the presence of air inside the apparatus. Examples of suitable sealing methods include, but are not limited to, metal-to-metal bonding (e.g., ultrasonic bonding, welding, pressing) and the use of additional material (e.g., polymer epoxy or solder).

Figure 9:
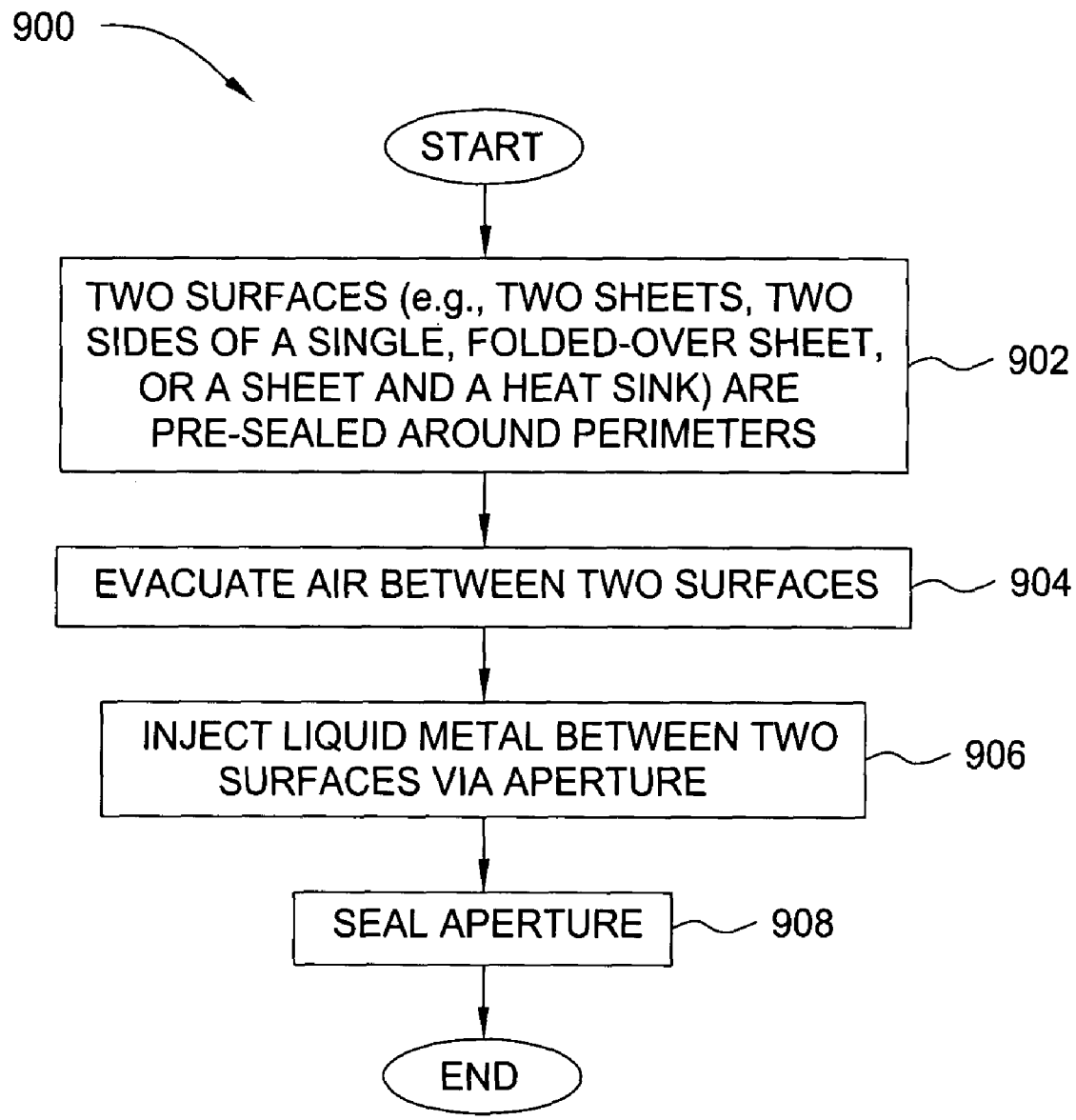
FIG. 9 illustrates a flow diagram illustrating a second method of fabricating a thermal interface according to the present invention, wherein said thermal interface is injected with liquid metal.

FIG. 9 is a flow diagram illustrating a method 900 of fabricating a thermal interface according to the present invention. In step 902, two surfaces (e.g., two sheets, two sides of a single, folded-over sheet, or a sheet and a heat sink) are pre-sealed around their perimeters, for example by any of the sealing methods mentioned with respect to the method 800 illustrated in FIG. 8, leaving only a small aperture unsealed. In step 904, air between the two surfaces is evacuated. In step 906, a controlled amount of liquid metal is injected between the two surfaces via the aperture. To complete fabrication, the aperture is sealed in step 908.

Figure 10:
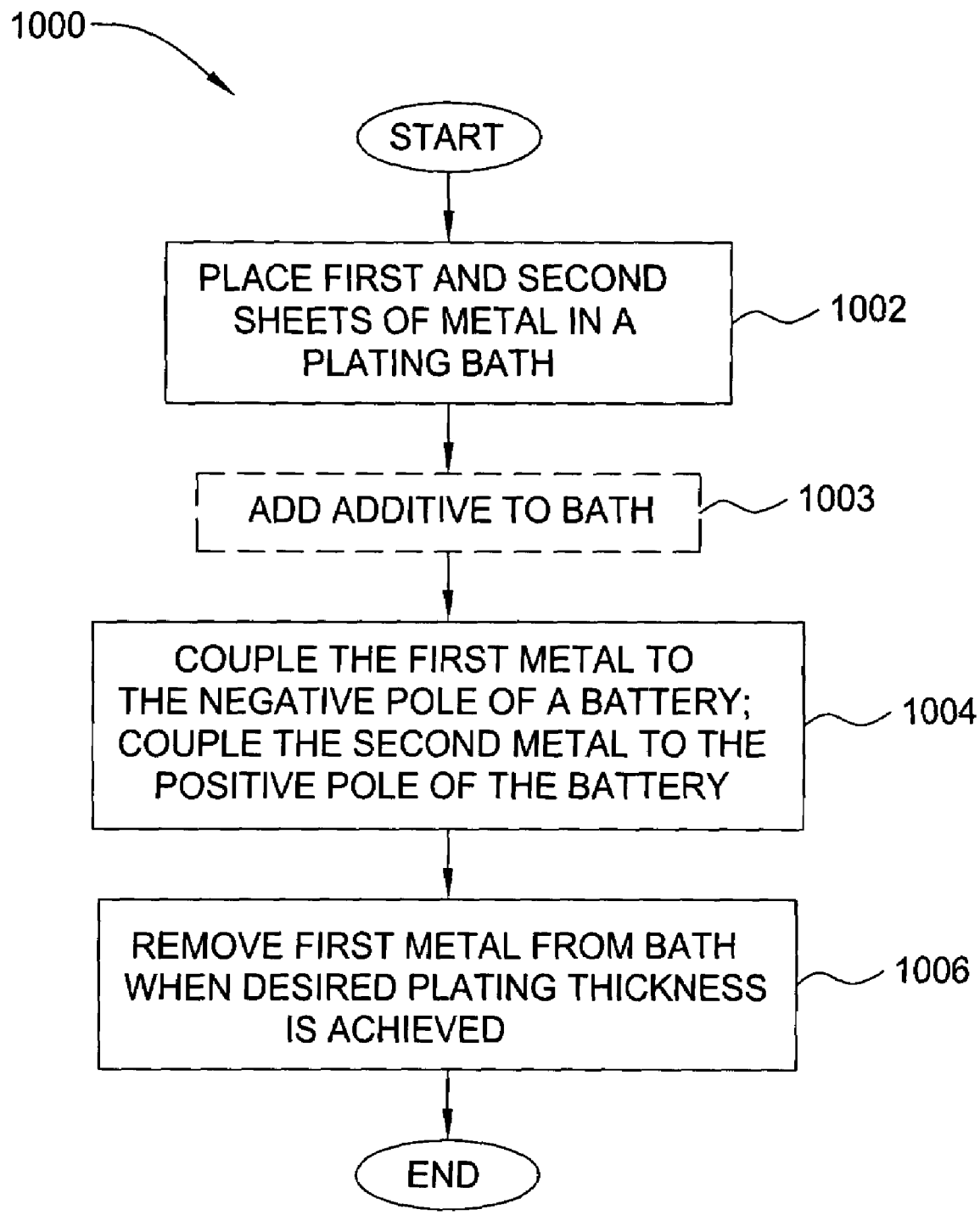
FIG. 10 illustrates a flow diagram illustrating a third method of fabricating a thermal interface according to the present invention, wherein said thermal interface is fabricated by plating.

FIG. 10 is a flow diagram illustrating a method 1000 of fabricating a thermal interface according to the present invention. In step 1002, a thin sheet of a first metal (e.g., the metal that will be contained in liquid phase, such as solid gallium) and a piece of a second, plating metal (e.g., the flexible metal that will enclose the liquid metal, such as copper) are placed in a plating bath (e.g., copper sulfate). The plating bath is held at a temperature below the melting point of the first metal, so that it remains in its solid phase. In step 1004, the first metal is coupled to the negative pole of a battery, and the second metal is coupled to the positive pole, causing material from the second metal to be attracted to the first metal. In step 1006, the first metal is removed from the bath when it has been plated to the desired thickness with the second metal. The method 1000 ensures that no air or other foreign material is trapped between the first and second metals. In one embodiment, additives are added to the bath at optional step 1003 to enhance uniformity of the plating.

Thus, the present invention represents a significant advancement in the field of integrated circuit chip cooling. A thermal interface is disclosed that facilitates reliable and improved heat transfer between a chip and a heat sink, allowing the IC device to operate more efficiently than is enabled by conventional heat transfer methods. Furthermore, the thermal interface is held in place by mechanical pressure rather than by direct bonding to the IC device components, making the apparatus easier to remove for device repair and inspection.

While foregoing is directed to the preferred embodiment of the present invention, other and further embodiments of the invention may be devised without departing from the basic scope thereof, and the scope thereof is determined by the claims that follow.

The invention claimed is:

1. A thermal interface comprising:
    a thermally conductive fluid;
    a flexible enclosure for confining the thermally conductive fluid; and
    at least one containment pad surrounding a perimeter edge of the enclosure.

2. The thermal interface of claim 1, further comprising:
    a flexible liner lining an interior surface of the enclosure.

3. The thermal interface of claim 2, wherein the liner is formed from a chemically inert metal.

4. The thermal interface of claim 1, wherein the at least one containment pad comprises:
    an indentation sized and positioned to receive the perimeter edge of the enclosure, for sealing the thermal interface against an outside environment.

5. The thermal interface of claim 1, wherein the thermally conductive fluid is a liquid metal.

6. The thermal interface of claim 5, wherein the liquid metal is selected from a group consisting of gallium, mercury, gallium-indium and mercury-gold.

7. The thermal interlace of claim 1, wherein the enclosure comprises:
    at least one flexible metal foil.

8. The thermal interface of claim 7, wherein the at least one flexible metal foil is selected from a group consisting of copper, aluminum, stainless steel, nickel and silicon.

9. The thermal interface of claim 7, wherein the enclosure comprises:
two flexible foils sealed together around a perimeter edge to form a cavity therebetween.

10. The thermal interface of claim 7, wherein the enclosure comprises:
a single flexible foil folded over and sealed around a perimeter edge to create a pocket.

11. An integrated circuit device comprising:
at least one heat source;
at least one heat sink positioned in proximity to the at least one heat source; and
at least one thermal interface positioned between the at least one heat source and the at least one heat sink, the thermal interface comprising:
a thermally conductive fluid;
an enclosure for confining the thermally conductive fluid, wherein at least one surface of the enclosure is flexible and the enclosure is in thermal contact with both the at least one heat source and the at least one heat sink; and
at least one flexible gasket sealing a perimeter around the at least one heat source and the at least one heat sink.

12. The integrated circuit device of claim 11, wherein the at least one thermal interface further comprises:
a flexible liner lining an interior surface of the enclosure.

13. The integrated circuit device of claim 12, wherein the liner is formed from a chemically inert metal.

14. The integrated circuit device of claim 11, further comprising:
at least one optimization layer disposed between the at least one thermal interface and the at least one heat source, between the at least one thermal interface and the at least one heat sink, or both, the optimization layer comprising a material selected from the group consisting of water, epoxy, oil, paste, solder, organic fluid and liquid metal.

15. The integrated circuit device of claim 11, wherein the thermally conductive fluid is a liquid metal.

16. The integrated circuit device of claim 11, wherein the enclosure comprises:
at least one flexible metal foil.

17. The integrated circuit device of claim 16, wherein the enclosure comprises:
two flexible foils sealed together around a perimeter edge to form a cavity therebetween.

18. The integrated circuit device of claim 16, wherein the enclosure comprises:
a single flexible foil folded over and sealed around a perimeter edge to create a pocket.

19. The integrated circuit device of claim 16, wherein the enclosure comprises a single metal foil sealed around its perimeter edge to a surface of the at least one heat sink.

20. The integrated circuit device of claim 11, wherein the at least one thermal interface comprises a plurality of thermal interfaces arranged in the form of an interposer.

21. An integrated circuit device comprising:
at least one heat source;
at least one heat sink positioned in proximity to the at least one heat source; and
at least one thermal interface positioned between the at least one heat source and the at least one heat sink, the thermal interface comprising:
a thermally conductive fluid retained between the at least one heat source and the at least one heat sink; and
at least one flexible gasket sealing a perimeter around the at least one heat source and the at least one heat sink, for retaining the fluid therebetween.

22. Method for facilitating heat transfer from a heat source to a heat sink, the method comprising the steps of:
providing a thermally conductive fluid between the heat source and the heat sink, said thermally conductive fluid being in thermal contact with both the heat source and the heat sink; and
enclosing the thermally conductive fluid in a thermally conductive enclosure, wherein at least a portion of the enclosure is flexible, and wherein the step of enclosing the thermally conductive fluid comprises enclosing the fluid in a cavity formed between the heat source and the heat sink, the cavity being sealed around a perimeter by a flexible gasket.

23. The method of claim 22, wherein the step of enclosing the thermally conductive fluid comprises enclosing the fluid in a cavity formed between two flexible foils.

24. The method of claim 22, wherein the step of enclosing the thermally conductive fluid comprises enclosing the fluid in a cavity formed between a flexible foil and the heat sink, the flexible foil being sealed to the heat sink around a perimeter edge.

25. Method for assembling a multi-chip integrated circuit device comprising the steps of:
assembling two or more integrated circuit chips on a substrate;
placing a thermal interface in contact with each of the two or more integrated circuit chips, the thermal interface comprising:
a thermally conductive fluid;
a flexible enclosure for confining the thermally conductive fluid; and
at least one containment pad surrounding a perimeter edge of the enclosure; and
placing a heat sink in thermal contact each of the two or more integrated circuit chips.

26. An integrated circuit device comprising:
at least one heat source;
at least one heat sink positioned in proximity to the at least one heat source; and
at least one thermal interface positioned between the at least one heat source and the at least one heat sink, the thermal interface comprising:
a thermally conductive fluid;
an enclosure for confining the thermally conductive fluid, wherein at least one surface of the enclosure is flexible and the enclosure is in thermal contact with both the at least one heat source and the at least one heat sink; and
at feast one containment pad surrounding a perimeter edge of the enclosure.

27. The integrated circuit device of claim 26, wherein the at least one containment pad comprises:
an indentation sized and positioned to receive the perimeter edge of the enclosure, for sealing the at least one thermal interface against an outside environment.

* * * * *